US012603464B2

(12) United States Patent
Izumi et al.

(10) Patent No.: US 12,603,464 B2
(45) Date of Patent: Apr. 14, 2026

(54) ELECTRICAL CONNECTOR UNIT USING ELECTROMAGNETIC SHIELD MEMBER

(71) Applicant: SUMITOMO WIRING SYSTEMS, LTD., Mie (JP)

(72) Inventors: Kaishi Izumi, Mie (JP); Masaaki Yoshikawa, Mie (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 280 days.

(21) Appl. No.: 18/282,652

(22) PCT Filed: Mar. 24, 2022

(86) PCT No.: PCT/JP2022/014111
§ 371 (c)(1),
(2) Date: Sep. 18, 2023

(87) PCT Pub. No.: WO2022/203015
PCT Pub. Date: Sep. 29, 2022

(65) Prior Publication Data
US 2024/0162666 A1      May 16, 2024

(30) Foreign Application Priority Data
Mar. 25, 2021    (JP) ................................. 2021-051801

(51) Int. Cl.
*H01R 13/6596* (2011.01)
*H01R 9/24* (2006.01)
(Continued)

(52) U.S. Cl.
CPC ....... *H01R 13/6596* (2013.01); *H01R 9/2458* (2013.01); *H01R 13/6581* (2013.01);
(Continued)

(58) Field of Classification Search
CPC .............. H01R 13/6596; H01R 9/2458; H01R 13/6581; H01R 9/24; H01R 9/2483;
(Continued)

(56) References Cited

U.S. PATENT DOCUMENTS

2018/0019549 A1*   1/2018   Makido .............. H01R 13/5216
2018/0219327 A1    8/2018   Hirooka et al.

FOREIGN PATENT DOCUMENTS

JP      2012-059440 A     3/2012
JP      2016-219103 A    12/2016
JP      2021-002647 A     1/2021

OTHER PUBLICATIONS

International Search Report issued on Jun. 14, 2022 for WO 2022/203015 A1 (4 pages).

* cited by examiner

*Primary Examiner* — Justin M Kratt
(74) *Attorney, Agent, or Firm* — Venjuris, P.C.

(57) ABSTRACT

A connector unit is provided with a first connector, a second connector, a plurality of wires for electrically connecting the first connector and the second connector, an electromagnetic shield member for covering the plurality of wires, an electromagnetic shield cover fixed to the first connector while covering the first connector, and an electrically conductive bracket to be fixed to a ground target part while being separated from the second connector. The electromagnetic shield cover includes a cover body and a cover fixing plate to be fixed to the cover body. One end part of the electromagnetic shield member is fixed to the electromagnetic shield cover by being sandwiched by the cover body and the cover fixing plate. The electrically conductive bracket is fixed to another end part of the electromagnetic shield member. The electrically conductive bracket includes a (Continued)

reinforcing rib projecting in a thickness direction of the electrically conductive bracket.

9 Claims, 5 Drawing Sheets

(51) Int. Cl.
    *H01R 13/6581*      (2011.01)
    *H05K 9/00*      (2006.01)
    *H01R 13/648*      (2006.01)
    *H01R 13/658*      (2011.01)
    *H01R 13/6591*      (2011.01)
    *H01R 13/6592*      (2011.01)

(52) U.S. Cl.
    CPC ................. *H05K 9/00* (2013.01); *H01R 9/24* (2013.01); *H01R 9/2483* (2013.01); *H01R 13/648* (2013.01); *H01R 13/658* (2013.01); *H01R 13/6591* (2013.01); *H01R 13/65912* (2020.08); *H01R 13/65914* (2020.08); *H01R 13/6592* (2013.01); *H01R 2201/26* (2013.01)

(58) Field of Classification Search
    CPC ................ H01R 13/648; H01R 13/658; H01R 13/6591; H01R 13/65912; H01R 13/65914; H01R 13/6592; H01R 2201/26; H05K 9/00
    See application file for complete search history.

ELECTRICAL CONNECTOR UNIT USING ELECTROMAGNETIC SHIELD MEMBER

CROSS REFERENCE TO RELATED APPLICATIONS

This application is a national phase of PCT application No. PCT/JP2022/014111, filed on 24 Mar. 2022, which claims priority from Japanese patent application No. 2021-051801, filed on 25 Mar. 2021, all of which are incorporated herein by reference.

TECHNICAL FIELD

The present disclosure relates to a connector unit.

BACKGROUND

For example, a connector unit used in a vehicle or the like is disclosed in Patent Document 1. This connector unit is provided with a first connector, a second connector and a plurality of wires for electrically connecting the first and second connectors. Further, this connector unit is provided with an electromagnetic shield member for covering the plurality of wires, an electromagnetic shield cover fixed to one end part of the electromagnetic shield member, and a bracket fixed to the other end part of the electromagnetic shield member. The electromagnetic shield member is, for example, a metal braid configured into a sheet shape by conductors. The electromagnetic shield cover is fixed to the first connector while covering the first connector. The electromagnetic shield member is fixed to the electromagnetic shield cover by sandwiching an end part of the electromagnetic shield member by a bent fixing portion formed by bending and deforming the electromagnetic shield cover to fold a part of the electromagnetic shield cover.

PRIOR ART DOCUMENT

Patent Document

Patent Document 1: JP 2017-022264 A

SUMMARY OF THE INVENTION

Problems to be Solved

In the electromagnetic shield cover as described above, the bent fixing portion is folded toward a side where the electromagnetic shield member is pulled out from the electromagnetic shield cover. Thus, the electromagnetic shield cover is formed with an opening as the bend fixing portion is formed. Here, it is desired to further enhance a shielding effect by the electromagnetic shield cover, the electromagnetic shield member and the like.

Accordingly, the present disclosure aims to further enhance an electromagnetic shielding effect in a connector unit.

Means to Solve the Problem

The present disclosure is directed to a connector unit with a first connector, a second connector, a plurality of wires for electrically connecting the first connector and the second connector, an electromagnetic shield member for covering the plurality of wires in a state capable of electromagnetic shielding, an electromagnetic shield cover fixed to the first connector while covering the first connector, and an electrically conductive bracket to be fixed to a ground target part while being separated from the second connector, the electromagnetic shield cover including a cover body and a cover fixing plate to be fixed to the cover body, one end part of the electromagnetic shield member being fixed to the electromagnetic shield cover by being sandwiched by the cover body and the cover fixing plate, the electrically conductive bracket being fixed to another end part of the electromagnetic shield member, and the electrically conductive bracket including a reinforcing rib projecting in a thickness direction of the electrically conductive bracket.

Effect of the Invention

According to the present disclosure, an electromagnetic shielding effect in a connector unit is further enhanced.

DETAILED DESCRIPTION TO EXECUTE THE INVENTION

Description of Embodiments of Present Disclosure

Figure 1:
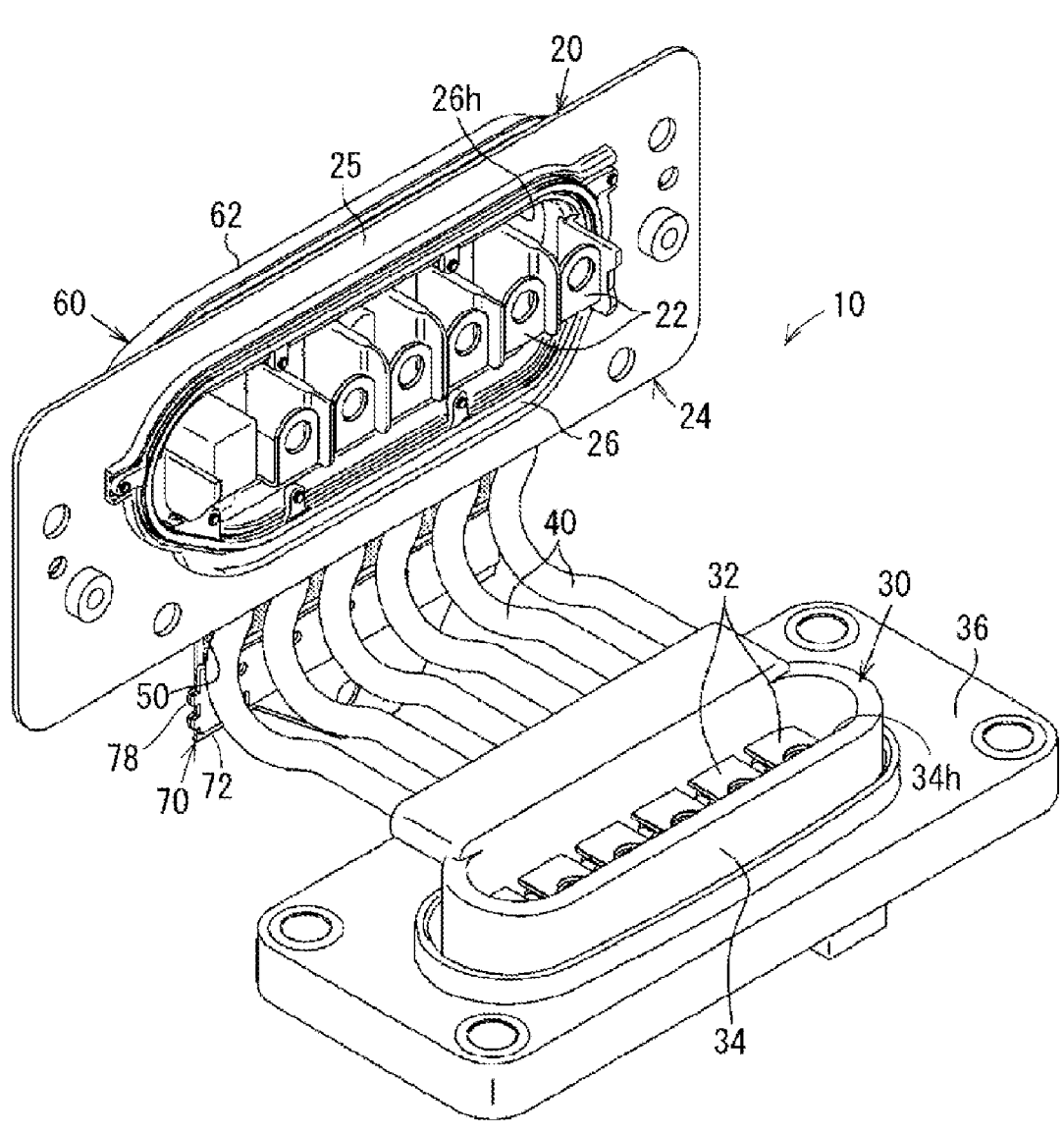
FIG. 1 is a perspective view showing a connector unit according to an embodiment.

First, embodiments of the present disclosure are listed and described.

The connector unit of the present disclosure is as follows.

(1) The connector unit of the present disclosure is provided with a first connector, a second connector, a plurality of wires for electrically connecting the first connector and the second connector, an electromagnetic shield member for covering the plurality of wires in a state capable of electromagnetic shielding, an electromagnetic shield cover fixed to the first connector while covering the first connector, and an electrically conductive bracket to be fixed to a ground target part while being separated from the second connector, the electromagnetic shield cover including a cover body and a cover fixing plate to be fixed to the cover body, one end part of the electromagnetic shield member being fixed to the electromagnetic shield cover by being sandwiched by the cover body and the cover fixing plate, the electrically conductive bracket being fixed to another end part of the electromagnetic shield member, and the electrically conductive bracket including a reinforcing rib projecting in a thickness direction of the electrically conductive bracket.

According to this connector unit, the one end part of the electromagnetic shield member is fixed by being sandwiched by the cover body and the cover fixing plate. In this way, the electromagnetic shield member can be fixed to the electromagnetic shield cover even without providing an opening in the electromagnetic shield cover. Further, the electrically conductive bracket can be fixed and grounded to the ground target part while being separated from the second connector. At this time, since the electrically conductive bracket is formed with the reinforcing rib, vibration in the thickness direction is suppressed and the electrically conductive bracket is stably fixed to the ground target part. As a result, an electromagnetic shielding effect in the connector unit is further enhanced.

(2) In the connector unit of (1), a recess as a press mark for fixing the electromagnetic shield member may be formed in at least one of the electromagnetic shield cover and the electrically conductive bracket, and the recess may be open toward the electromagnetic shield cover or a side of the electrically conductive bracket to be fixed. If the recess is open inside the electromagnetic shield cover in this way, water is unlikely to stay in the recess and corrosion resistance is improved.

(3) In the connector unit of (2), the recess may be open downward rather than in a horizontal direction. In this way, water is easily discharged to outside even if intruding into the recess.

(4) In the connector unit of any one of (1) to (3), the second connector may include a plurality of terminals to be connected to other ends of the plurality of wires and a housing made of resin for holding the plurality of terminals. Since the housing of the second connector can be easily formed of resin, a cost reduction is possible.

(5) In the connector unit of any one of (1) to (4), the electromagnetic shield member may cover the plurality of wires only on one side in a direction perpendicular to an arrangement direction of the plurality of wires. In this way, a used amount of a material of the electromagnetic shield member can be reduced.

(6) In the connector unit of any one of (1) to (5), the electrically conductive bracket may include a bracket fixing portion extending toward the ground target part from a part fixed to the electromagnetic shield member, and the reinforcing rib may include a fixing portion reinforcing rib formed on the bracket fixing portion. In this way, the bracket fixing portion can be reinforced and the vibration of the electrically conductive bracket in the thickness direction about a fixed position is suppressed.

(7) In the connector unit of any one of (1) to (6), the electrically conductive bracket may include a bracket body to be fixed to the ground target part and a bracket fixing plate to be fixed to the bracket body, the other end part of the electromagnetic shield member may be fixed to the electrically conductive bracket by being sandwiched by the bracket body and the bracket fixing plate, and one of the bracket body and the bracket fixing plate may include a protective extending portion extending in an extending direction of the electromagnetic shield member from an overlapping region of the bracket body and the bracket fixing plate. In this case, the electromagnetic shield member can be protected by the protective extending portion.

(8) In the connector unit of (7), the protective extending portion may be formed to have a width smaller than a width of the overlapping region of the bracket body and the bracket fixing plate. By forming the protective extending portion to have the width smaller than that of the overlapping region of the bracket body and the bracket fixing plate in accordance with a protection requiring region in this way, a weight reduction is possible.

(9) In the connector unit of (7) or (8), the reinforcing rib may include an extending portion reinforcing rib formed on the protective extending portion. In this way, the vibration of the protective extending portion in a thickness direction thereof is suppressed.

(10) In the connector unit of any one of (7) to (9), a hole may be formed in the protective extending portion. In this way, the electrically conductive bracket can be reduced in weight.

Details of Embodiment of Present Disclosure

A specific example of a connector unit of the present disclosure is described below with reference to the drawings. Note that the present disclosure is not limited to these illustrations, but is represented by claims and intended to include all changes in the scope of claims and in the meaning and scope of equivalents.

Embodiment

Figure 2:
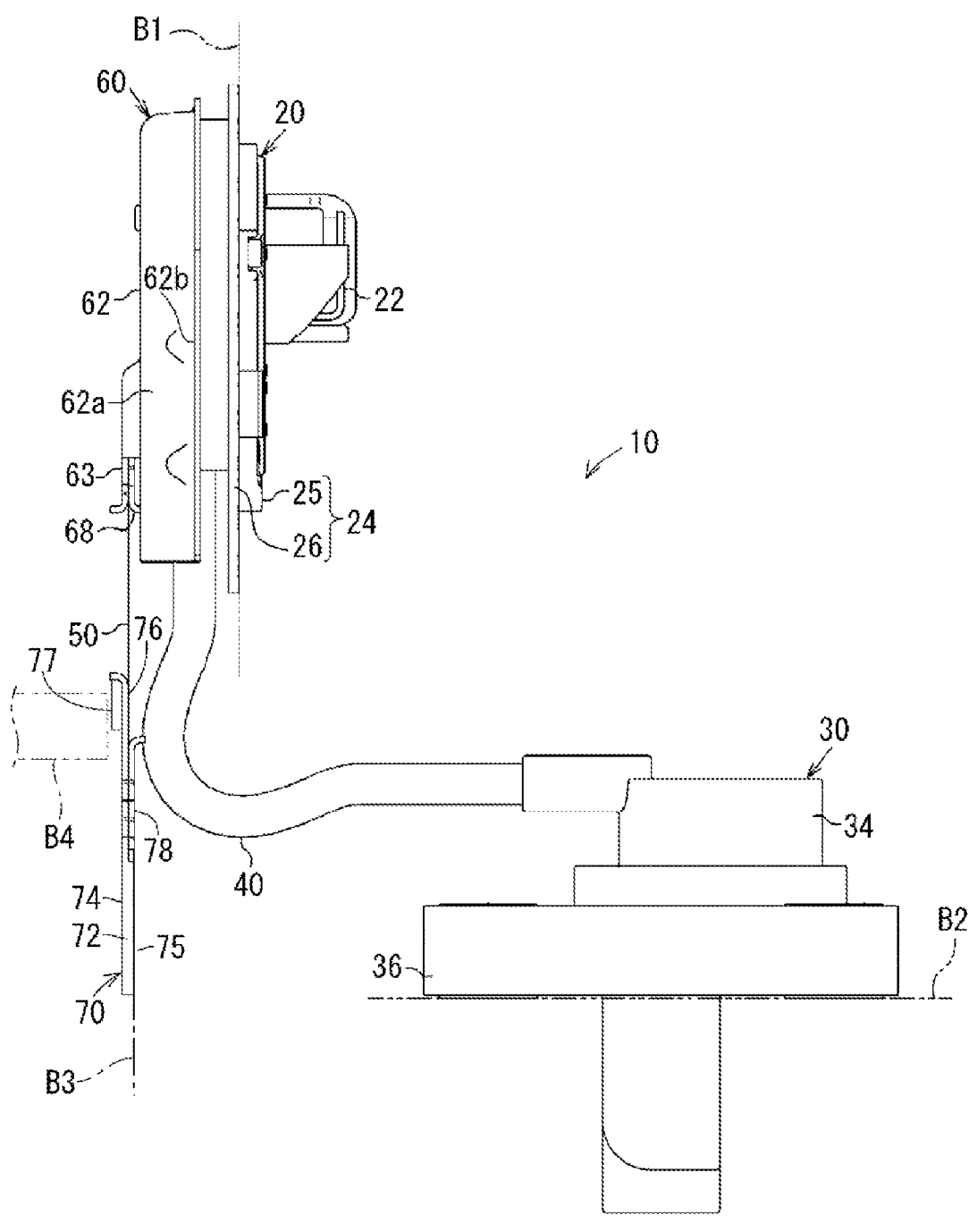
FIG. 2 is a side view showing the connector unit.

Hereinafter, a connector unit according to an embodiment is described. FIG. 1 is a perspective view showing a connector unit 10, and FIG. 2 is a side view showing the connector unit 10. In FIG. 2, parts of devices B1, B2 and B serving as mounting objects and a peripheral device B4 are shown.

<Overall Configuration of Connector Unit>

An overall configuration of the connector unit 10 is described. The connector unit 10 is provided with a first connector 20, a second connector 30, a plurality of wires 40, an electromagnetic shield member 50, an electromagnetic shield cover 60 and an electrically conductive bracket 70.

The first connector 20 is fixed to the first device B1. The second connector 30 is fixed to the second device B2. The devices B1, B2 are in-vehicle devices. For example, the first device B1 is an inverter, and the second device B2 is a travel drive motor in an electric or hybrid vehicle. The plurality of wires 40 electrically connect the first and second connectors 20, 30. In this way, the first and second devices B1, B2 are electrically connected. That is, a wiring component for electrically connecting the first and second devices B1, B2 is constituted by the first connector 20, the second connector 30 and the plurality of wires 40. In this embodiment, the first and second connectors 20, 30 are connectors for high voltage, and the plurality of wires 40 are wires for high voltage.

The electromagnetic shield member 50 is a member for covering the plurality of wires 40 in a state capable of electromagnetic shielding. The electromagnetic shield cover 60 is a member to be fixed to the first connector 20 while covering the first connector 20. The electromagnetic shield cover 60 is fixed to the first device B1 via the first connector 20. The electrically conductive bracket 70 is a member to be fixed to the device B3, which is an example of a part to be grounded or fixed, while being separated from the second connector 30. The device B3 may be the same as the device B2 or may be different from the device B2. One end part of the electromagnetic shield member 50 is fixed to the electromagnetic shield cover 60. Another end part of the electromagnetic shield member 50 is fixed to the electrically conductive bracket 70. Thus, the electromagnetic shield member 50 is grounded to the first device B1 via the electromagnetic shield cover 60. Further, the electromagnetic shield member 50 is grounded to the device B3 via the electrically conductive bracket 70. An electromagnetic shielding unit is constituted by the electromagnetic shield member 50, the electromagnetic shield cover 60 and the electrically conductive bracket 70.

Each component is more specifically described.

<Concerning First Connector>

The first connector 20 is provided with a plurality of first terminals 22 and a first holding member 24 for holding the plurality of first terminals 22. Each first terminal 22 is connected to one end part of each wire 40.

The first holding member 24 is, for example, provided with a base member 25 and a resin portion 26. The base member 25 is, for example, formed by press-working a metal plate. An elliptical through hole is formed in a central part of the base member 25, and the resin portion 26 is integrally formed on a peripheral edge part of that through hole.

The resin portion 26 is formed by molding with the plurality of first terminals 22 as insert parts. The plurality of first terminals 22 are held in parallel by the resin portion 26. Connected parts of the plurality of first terminals 22 and the wires 40 are provided in the resin portion 26. The resin portion 26 includes a part having an annular frame shape along the peripheral edge part of the through hole of the base member 25, and an opening 26h is formed inside that part. Out of the plurality of first terminals 22, device-side connecting end parts on a side opposite to the wires 40 extend in the opening 26h.

The base member 25 extends from an outer peripheral part of the resin portion 26. With the base member 25 held in contact with a case of the first device B1, the base member 25 is fixed to the first device B1 by screwing or the like. The case of the first device B1 is grounded to a vehicle body. Thus, the base member 25 is grounded via the case of the first device B1. In this way, with the first connector 20 fixed to the first device B1, terminals on the side of the first device B1 are connected to the device-side connecting end parts of the first terminals 22.

<Concerning Second Connector>

The second connector 30 is provided with a plurality of second terminals 32, a second holding member 34 for holding the plurality of second terminals 32 and a terminal block 36. Each second terminal 32 is connected to the other end part of each wire 40.

The second holding member 34 is, for example, formed of resin. The second holding member 34 is formed by molding with the plurality of second terminals 32 as insert parts. Connected parts of the plurality of second terminals 32 and the wires 40 are provided in the second holding member 34. The second holding member 34 includes a part having an annular frame shape, and an opening 34h is formed inside that part. Out of the plurality of second terminals 32, device-side connecting end parts on a side opposite to the wires 40 extend in the opening 34h.

The terminal block 36 is, for example, formed of resin. The terminal block 36 is formed into a shape protruding from the surrounding of the second holding member 36, e.g. into a plate-like shape. The terminal block 36 may be a resin part molded separately from the second holding member 34 and united with the second holding member 34. The terminal block 36 may be molded integrally with the second holding member 34.

The terminal block 36 is fixed to the second device B2 by screwing or the like. In this case, the terminal block 36 is formed with through holes for screwing. Tubular collars may be embedded in the through holes. The collars may be, for example, formed of a material having a higher rigidity than the resin for forming the terminal block 36, e.g. metal.

The terminal block 36 may hold a plurality of relay terminals. One end part of each relay terminal is connected to the device-side connecting end part of the second terminal, and the other end part of each relay terminal may be connected to a terminal on the side of the second device B2. Note that the device-side connecting end part of the second terminal may be connected to the terminal of the second device B2 without via the relay terminal.

The end parts of the plurality of wires 40 on one side are held in parallel by the first connector 20, and the end parts of the plurality of wires 40 on the other side are held in parallel by the second connector 30. Thus, intermediate parts of the plurality of wires 40 in a length direction are also held in parallel between the first and second connectors 20, 30. With the first connector 20 fixed to the first device B1 and the second connector 30 fixed to the second device B2, the plurality of wires 40 are easily bent in a direction intersecting a parallel direction of the wires 40.

<Concerning Electromagnetic Shielding Unit>

Figure 3:
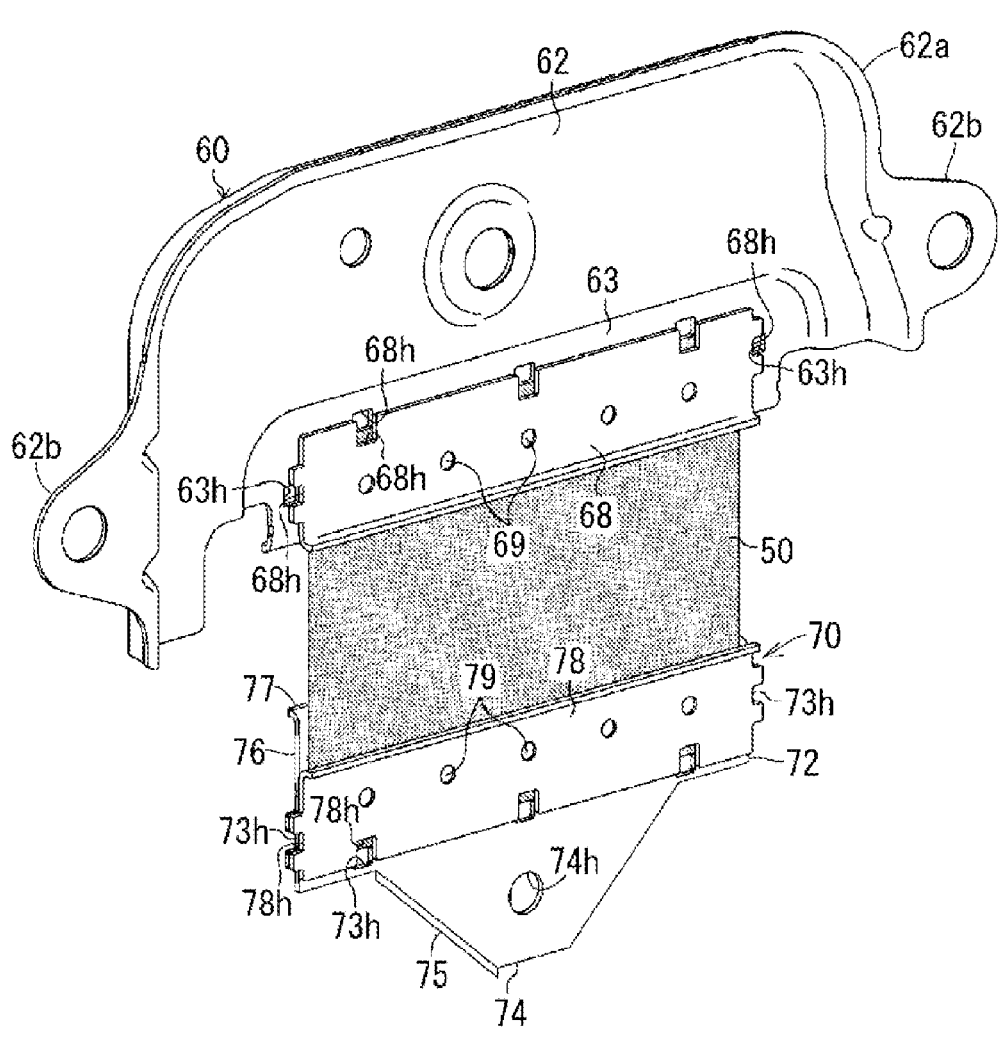
FIG. 3 is a perspective view showing an electromagnetic shielding unit.
Figures 4, 5:
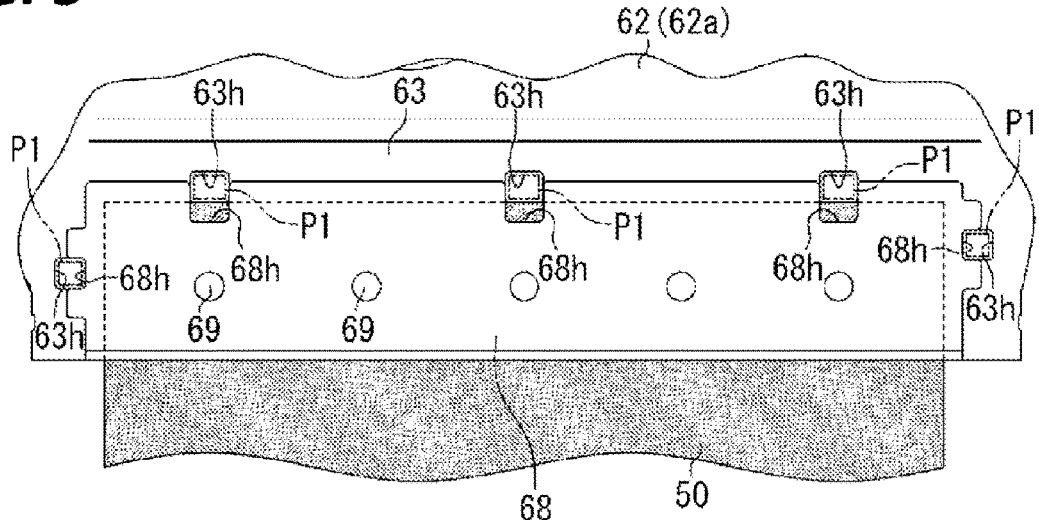
FIG. 4 is an exploded perspective view showing the electromagnetic shielding unit.
FIG. 5 is a view showing fixed positions of an electromagnetic shield member and an electromagnetic shield cover.

FIG. 3 is a perspective view showing the electromagnetic shielding unit, and FIG. 4 is an exploded perspective view showing the electromagnetic shielding unit. The electromagnetic shielding unit is provided with the electromagnetic shield member 50, the electromagnetic shield cover 60 and the electrically conductive bracket 70. The electromagnetic shield member 50 electromagnetically shields the plurality of wires 40, and the electromagnetic shield cover 60 electromagnetically shields the first connector 20. The electromagnetic shield member 50 is grounded via the electromagnetic shield cover 60 and the electrically conductive bracket 70.

<Concerning Electromagnetic Shield Member>

The electromagnetic shield member 50 is configured into a sheet shape by conductors. The electromagnetic shield member 50A is flexible to be bendable in a thickness direction. For example, the electromagnetic shield member 50 may be a braid formed into a sheet shape by braiding a plurality of strands formed by conductors. The strands may be formed of copper, copper alloy, aluminum or aluminum alloy. In this embodiment, the electromagnetic shield member 50 is formed into a rectangular sheet shape long in one direction.

The electromagnetic shield member 50 covers the plurality of wires 40 only on one side in a direction perpendicular to an arrangement direction of the plurality of wires 40. Thus, the plurality of wires 40 are not covered by an electromagnetic shield member on the other side opposite to the side where the electromagnetic shield member 50 is provided.

In this embodiment, with the first connector 20 fixed to the first device B1 and the second connector 30 fixed to the second device B2, the intermediate parts of the plurality of wires 40 are bent substantially by 90°. The electromagnetic shield member 50 covers the plurality of wires 40 only on the one side in a direction perpendicular to both a width direction, in which the plurality of wires 40 are arranged, and an extending direction of the plurality of wires 40, in parts of the plurality of wires 40 near the first connector 20.

For example, if the device B4, for which a measure against electromagnetic noise is necessary, is arranged on the one side with respect to the plurality of wires 40 in the direction perpendicular to the arrangement direction of the plurality of wires 40, electromagnetic shielding can be provided between the plurality of wires 40 and the device B4 by the electromagnetic shield member 50.

<Concerning Electromagnetic Shield Cover>

FIG. 5 is a view showing fixed positions of the electromagnetic shield member 50 and the electromagnetic shield cover 60 when viewed from the side of the first device B1. As shown in FIGS. 3 to 5, the electromagnetic shield cover 60 includes a cover body 62 and a cover fixing plate 68. The cover body 62 is a part for covering the first connector 20. The cover fixing plate 68 is a part to be fixed to the cover body 62 while being overlapped on the cover body 62. The cover body 62 and the cover fixing plate 68 are, for example, formed by press-working a metal plate.

The cover body 62 is fixed to the first connector 20 while covering the first connector 20. For example, the cover body 62 includes a covering part 62a for covering the first holding member 24 and fixing pieces 62b extending outward from the covering part 62a. The covering part 62a is formed into such a shape that a peripheral wall part projects from three surrounding sides of an elongated ceiling part to intersect the ceiling part. This covering part 62a covers an outward facing part (part on a side opposite to the first device B1) of the opening 26h, out of the first holding member 24, and three sides of the first holding member 24 except a side where the wires 40 extend. A pair of the first connectors 62b extend from both sides of the covering part 62a. With the fixing pieces 62b overlapped on the base member 25, the fixing pieces 62b are fixed to the base member 25 by screwing or the like. In this way, the electromagnetic shield cover 60 is fixed in contact with the first connector 20. Further, since the first connector 20 is fixed to the first device B1 as described above, the electromagnetic shield cover 60 is fixed to the first device B1 while being integrated with the first connector 20.

A plate-like fixing portion 63 is formed along an edge of the covering part 62a on the side where the wires 40 extend. The cover fixing plate 68 is formed into a rectangular plate shape long in one direction. The cover fixing plate 68 is overlapped on the fixing portion 63. One end part of the electromagnetic shield member 50 is fixed to the electromagnetic shield cover 60 by being sandwiched by the fixing portion 63 of the cover body 62 and the cover fixing plate 68. In this embodiment, the cover fixing plate 68 is overlapped on a side of the cover body 62 where the first connector 20 is accommodated (also on the side of the first device B1). The cover fixing plate 68 may be overlapped on a side of the cover body 62 opposite to the first connector 20.

A configuration example for fixing the cover fixing plate 68 in a state overlapped on the cover body 62 is described. For example, the cover fixing plate 68 is fixed to the cover body 62 by press-working with the cover fixing plate 68 and the cover body 62 overlapped.

More specifically, with the one end part of the electromagnetic shield member 50 sandwiched between the fixing portion 63 and the cover fixing plate 68 in the cover body 62, the cover fixing plate 68 and the cover body 62 are press-worked. At this time, a press die formed with partial projections is used as the one on one side, and a press die formed with recesses at positions facing the projections is used as the one on the other side. By pressing the cover body 62 and the cover fixing plate 68 by a pair of the press dies, projections formed on one of the cover body 62 and the cover fixing plate 68 are fit into recesses formed in the other, whereby the cover body 62 and the cover fixing plate 68 are fixed in an overlapping state.

For example, press-working is performed with the projections of the press die on the one side pressed against the cover fixing plate 68 and the recesses of the press die on the other side arranged on the outward facing surface of the cover body 62. Then, parts of the cover fixing plate 68 are deformed to be pushed out toward the cover body 62. Parts shaped to be recessed when viewed from a side opposite to the cover body 62 and projecting when viewed from the side of the cover body 62 are formed as press marks of the cover fixing plate 68. Parts shaped to be recessed when viewed from the side of the cover fixing plate 68 and projecting when viewed from a side opposite to the cover fixing plate 68 are formed as press marks of the cover body 62. By fitting the projections as the press marks of the cover fixing plate 68 into the recesses as the press marks of the cover body 62 between the cover fixing plate 68 and the cover body 62, the cover fixing plate 68 is fixed in a state overlapped on the fixing portion 63 of the cover body 62. This fitting structure is established with the one end part of the electromagnetic shield member 50 interposed between the cover body 62 and the cover fixing plate 68.

The orientations of the recesses and projections are not particularly limited, but recesses 69 serving as the press marks observed from outside are preferably open on the side of the first device B1 as a fixing object of the electromagnetic shield cover 60. Since the cover fixing plate 68 is located on the side of the first device B1 with respect to the cover body 62 in this embodiment, the recesses 69 are preferably formed on the side of the cover fixing plate 68. Although the press marks are formed at a plurality of positions spaced apart in the length direction of the cover fixing plate 68 in the embodiment, the number of the press marks is arbitrary.

The recesses 69 as the press marks are preferably open downward rather than in a horizontal direction orthogonal to a gravity direction. A long side edge of the cover fixing plate 68 on a side where the electromagnetic shield member 50 extends may be bent while being curved toward a side opposite to the electromagnetic shield member 50. This makes it difficult for the edge of the cover fixing plate 68 to contact the electromagnetic shield member 50 in a small linear region.

The following configuration may be adopted to accurately position the cover fixing plate 68 and the one end part of the electromagnetic shield member 50 with respect to the cover body 62.

That is, first positioning holes 63h are formed on the peripheral edge of the fixing portion 63 of the cover body 62. The first positioning hole 63h has, for example, a rectangular shape when viewed from a plate thickness direction of the fixing portion 63. A plurality of the positioning holes 63h are, for example, provided along a boundary along which the cover fixing plate 68 is arranged. For example, the plurality of first positioning holes 63h are formed at intervals along one long side (long side on the side opposite to the side where the electromagnetic shield member 50 extends) of the cover fixing plate 68 to be overlapped on the fixing portion 63. Further, the first positioning holes 63h are formed at positions along both short sides of the cover fixing plate 68 to be overlapped on the fixing portion 63.

First positioning recesses 68h are formed on the outer peripheral edge of the cover fixing plate 68. The first positioning recess 68h is, for example, formed into a substantially rectangular recess when viewed from a plate thickness direction of the cover fixing plate 68. A plurality of the first positioning recesses 68h are, for example, provided on the outer peripheral edge of the cover fixing plate 68. For example, the plurality of first positioning recesses 68h are formed at intervals on one long side edge of the cover fixing plate 68. Further, the first positioning recesses 68*h* are also formed on both short side edges of the cover fixing plate 68.

The plurality of first positioning recesses 68*h* respectively correspond to the plurality of first positioning holes 63*h*. With the cover fixing plate 68 fixed to the fixing portion 63, the respective first positioning recesses 68*h* and the respective first positioning holes 63*h* are formed in at least partially overlapping regions when viewed along the thickness directions of the fixing portion 63 and the cover fixing plate 68.

Note that the first positioning recesses 68*h* formed on the long side edge of the cover fixing plate 68 are formed to be more recessed inwardly of the cover fixing plate 68 than the first positioning holes 63*h*. With the cover fixing plate 68 overlapped on the fixing portion 63, the first positioning holes 63*h* can be arranged in regions near openings, out of the first positioning recesses 68*h*, and an end edge part of the one end part of the electromagnetic shield member 50 can be located in regions near back sides of the first positioning recesses 68*h*.

In fixing the cover fixing plate 68 to the fixing portion 63 of the cover body 62 by press-working or the like, positioning is performed as follows.

First, when the fixing portion 63 of the cover body 62 is, for example, placed on the press die, a plurality of first positioning pins P1 projecting from this press die are respectively inserted into the plurality of first positioning holes 63*h* of the fixing portion 63.

Subsequently, the one end part of the electromagnetic shield member 50 is placed on the fixing portion 63 of the cover body 62. At this time, the edge part of the electromagnetic shield member 50 can be positioned by being butted against the first positioning pins P1, which will be arranged along the one long side of the cover fixing plate 68.

Subsequently, the cover fixing plate 68 is overlapped on the electromagnetic shield member 50 placed on the fixing portion 63. At this time, the plurality of first positioning pins P1 are inserted into the first positioning recesses 68*h* of the cover fixing plate 68. In this way, the cover fixing plate 68 is positioned with respect to the cover body 62 in a surface spreading direction of the fixing portion 63 and the cover fixing plate 68.

Note that gaps are present between the first positioning pins P1 arranged along the one long side of the cover fixing plate 68 and back side parts of the first positioning recesses 68*h*. By observing the presence or absence of the end edge of the electromagnetic shield member 50 through these gaps, it can be confirmed whether or not the electromagnetic shield member 50 is arranged at a predetermined position to be in contact with the first positioning pins P1.

By performing the press-working in this state, the one end part of the electromagnetic shield member 50 is sandwiched between the cover body 62 and the cover fixing plate 68, whereby the one end part of the electromagnetic shield member 50 is fixed to the electromagnetic shield cover 60.

<Concerning Electrically Conductive Bracket>

Figure 6:
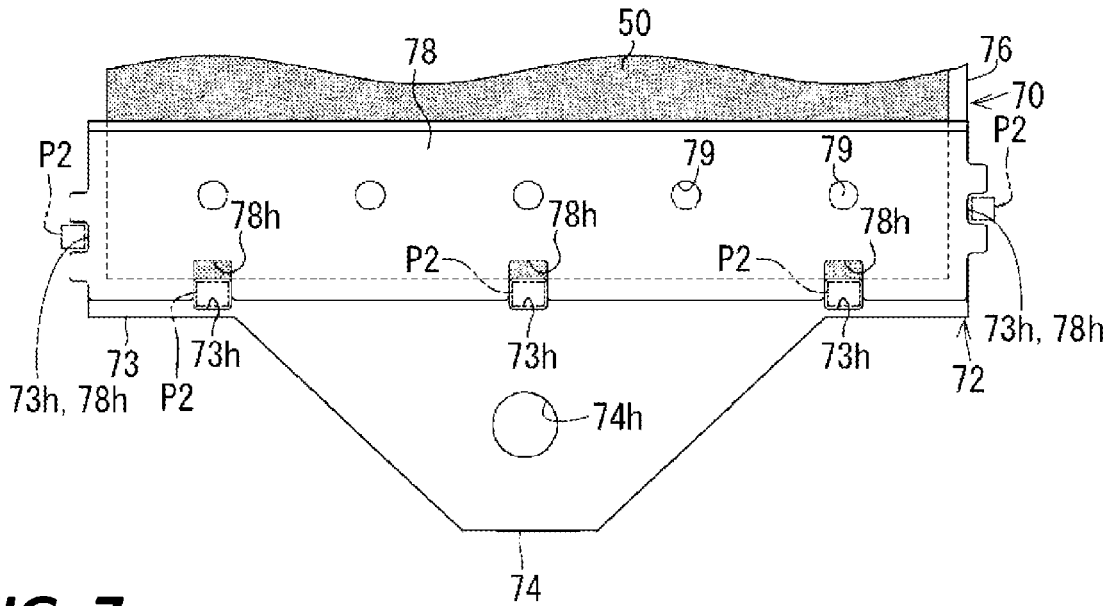
FIG. 6 is a view showing fixed positions of an electrically conductive bracket and the electromagnetic shield cover.
Figure 7:
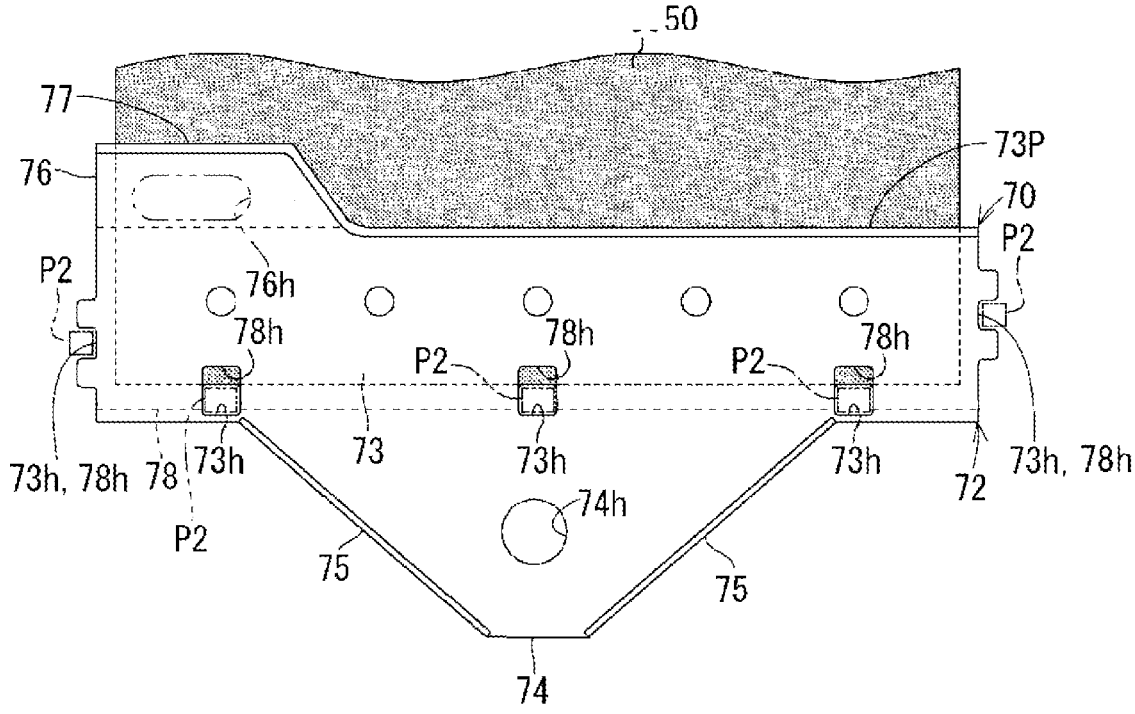
FIG. 7 is a view showing the fixed positions of the electrically conductive bracket and the electromagnetic shield cover when viewed from another direction.

FIG. 6 is a view showing fixed positions of the electrically conductive bracket 70 and the electromagnetic shield cover 60 when viewed from the side of the device B3, which is an example of a ground target part. FIG. 7 is a view showing the fixed positions when viewed from a side opposite to the device B3.

The electrically conductive bracket 70 is a member to be fixed to the other end part of the electromagnetic shield member 50. This electrically conductive bracket 70 is formed with reinforcing ribs 75, 77 projecting in a thickness direction of the electrically conductive bracket 70. The deformation of the electrically conductive bracket 70 in the thickness direction is suppressed and, for example, vibration centered on the fixed position of the electrically conductive bracket 70 is reduced by these reinforcing ribs 75, 77.

In this embodiment, the electrically conductive bracket 70 includes a bracket body 72 and a bracket fixing plate 78. The bracket body 72 and the bracket fixing plate 78 are members formed, such as by press-working a metal plate.

The bracket body 72 is a part to be fixed to the device B3. The bracket fixing plate 78 is fixed to the bracket body 72 while being overlapped on the bracket body 72. By sandwiching the other end part of the electromagnetic shield member 50 by the bracket body 72 and the bracket fixing plate 78, the other end part of the electromagnetic shield member 50 is fixed to the electrically conductive bracket 70.

More specifically, the bracket body 72 includes a fixing portion 73, on which the bracket fixing plate 78 is overlapped. The fixing portion 73 is formed into a rectangular shape long in one direction. The bracket fixing plate 78 is formed into a rectangular shape long in the one direction. The bracket fixing plate 78 may have the same shape as the cover fixing plate 68.

A configuration for fixing the bracket fixing plate 78 in a state overlapped on the bracket body 72 may be the same as the configuration for fixing the cover fixing plate 68 to the cover body 62.

That is, with the other end part of the electromagnetic shield member 50 sandwiched between the fixing portion 73 and the bracket fixing plate 78 in the bracket body 72, the bracket fixing plate 78 and the bracket body 72 are pressworked. At this time, a press die formed with partial projections is used as the one on one side, and a press die formed with recesses at positions facing the projections is used as the one on the other side. By pressing the bracket body 72 and the bracket fixing plate 78 by a pair of the press dies, projections formed on one of the bracket body 72 and the bracket fixing plate 78 are fit into recesses formed in the other, whereby the bracket body 72 and the bracket fixing plate 78 are fixed in an overlapping state.

The orientation of recesses 79 formed as press marks when viewed from outside is not particularly limited, but the recesses 79 are preferably open toward the side of the device B3 as a fixing object of the electrically conductive bracket 70. Since the bracket fixing plate 78 is located on the side of the device B3 with respect to the bracket body 72 in this embodiment, the recesses 79 are preferably formed on the side of the bracket fixing plate 78. Although the press marks are formed at a plurality of positions spaced apart in the length direction of the bracket fixing plate 78 in the embodiment, the number of the press marks is arbitrary.

The recesses 79 as the press marks are preferably open downward rather than in a horizontal direction orthogonal to a gravity direction.

Further, the electrically conductive bracket 70 includes a bracket fixing portion 74 and a protective extending portion 76.

The bracket fixing portion 74 extends toward the device B3, which is a ground target part, from the fixing portion 73 fixed to the electromagnetic shield member 50. The bracket fixing portion 74 extends from the fixing portion 73 in a direction different from an extending direction of the electromagnetic shield member 50 and, in this embodiment, extends in a direction opposite to the extending direction of the electromagnetic shield member 50.

The bracket fixing portion 74 extends from a part of a long side of the fixing portion 73 opposite to a side where the electromagnetic shield member 50 extends. Thus, the bracket fixing portion 74 includes a part formed to have a smaller dimension than the fixing portion 73 in a length direction of the fixing portion 73 (width direction of the electromagnetic shield member 50). For example, the bracket fixing portion 74 extends outward from an intermediate part of one long side of the fixing portion 73. The shape of the bracket fixing portion 74 is not particularly limited and may be, for example, formed into a trapezoidal shape, a triangular shape, a rectangular shape or a strip shape with a round tip part. The bracket fixing portion 74 having a trapezoidal shape is illustrated in this embodiment.

For example, a hole 74*h* for screwing is formed in the bracket fixing portion 74. By inserting a screw through this hole 74*h* and threadably fastened into a screw hole provided in the device B3, the bracket fixing portion 74 is fixed to the device B3.

The bracket fixing portion 74 extends outward from a partial position with respect to the fixing portion 73. Thus, the bracket fixing portion 74 is more easily deformed in the thickness direction than the fixing portion 73. In this embodiment, the reinforcing ribs 75, 77 include the fixing portion reinforcing ribs 75 formed on the bracket fixing portion 74.

Here, the fixing portion reinforcing ribs 75 are formed by bending edges corresponding to a pair of oblique sides of the bracket fixing portion 74 toward a side opposite to a side to be brought into contact with the device B3. The fixing portion reinforcing rib 75 may be formed on only one of the pair of oblique sides of the bracket fixing portion 74. In place of or in addition to the fixing portion reinforcing ribs formed on the edge of the bracket fixing portion 74 as just described, a fixing portion reinforcing rib may be formed inwardly of the edge of the bracket fixing portion 74. Such a fixing portion reinforcing rib can be formed, such as by press-working an elongated region inward of the edge of the bracket fixing portion 74 to be convex when viewed from one surface side and concave when view from the other surface side.

Vibration in the electrically conductive bracket 70 possibly occurs by a center of gravity near the fixing portion 73 swinging about the fixed position of the bracket fixing portion 74 to the device B3. Thus, the fixing portion reinforcing ribs 75 in the bracket fixing portion 74 are preferably present at least in a part of a range from the fixed position (i.e. the position where the hole 74*h* is formed) of the bracket fixing portion 74 to the fixing portion 73, more preferably entirely in this range.

The protective extending portion 76 extends in the extending direction of the electromagnetic shield member 50 from an overlapping region of the bracket body 72 and the bracket fixing plate 78. In this embodiment, the protective extending portion 76 extends from the bracket body 72. That is because the peripheral device B4 having a possibility of contacting the electromagnetic shield member 50 is present on the side of the bracket body 72 with respect to the bracket fixing plate 78. If a peripheral device having a possibility of contacting the electromagnetic shield member 50 is present on the side of the bracket fixing plate 78 with respect to the bracket body 72 unlike this example, a protective extending portion may extend from the bracket fixing plate 78. For example, this corresponds to a case where the bracket fixing plate 78 is overlapped on a side opposite to the device B3 with respect to the bracket body 72.

The protective extending portion 76 is set to have a width smaller than that of the overlapping region of the bracket body 72 and the bracket fixing plate 78 (dimension in the length direction of the fixing portion 73 or the bracket fixing plate 78).

More specifically, the protective extending portion 76 extends to cover the electromagnetic shield member 50 from a part of the long side of the fixing portion 73 on the side where the electromagnetic shield member 50 extends. The shape of the protective extending portion 76 is arbitrary and may be, for example, formed into a trapezoidal shape, a rectangular shape or a triangular shape. The formation region and shape of the protective extending portion 76 may be set in such a region that the protective extending portion 76 can be interposed between the peripheral device B4 and the electromagnetic shield member 50 and avoid the contact of the both in accordance with the position of the peripheral device B4 with respect to the electromagnetic shield member 50. In this embodiment, for example, assuming that the peripheral device B4 is arranged near one side of the other end part of the electromagnetic shield member 50, the protective extending portion 76 extends from a part near one end part of the long side of the fixing portion 73 where the electromagnetic shield member 50 extends. Further, an edge on a tip side of the protective extending portion 76 and the remaining part of the long side of the fixing portion 73 are connected via an oblique side. This oblique side is connected at an obtuse angle to the edge on the tip side of the protective extending portion 76 and the remaining part of the long side of the fixing portion 73.

The reinforcing ribs 75, 77 include the extending portion reinforcing rib 77 formed on the protective extending portion 76. Here, the extending portion reinforcing rib 77 is formed by bending the edge on the tip side of the protective extending portion 76 and an inward facing edge of the protective extending portion 76 in the length direction of the fixing portion 73 corresponding to the above oblique side toward a side opposite to the electromagnetic shield member 50. An extending portion reinforcing rib may be formed on an outward facing edge of the protective extending portion 76 in the length direction of the fixing portion 73. Further, in place of or in addition to the fixing portion reinforcing rib formed on the edge of the protective extending portion 76, an extending portion reinforcing rib may be formed inwardly of the edge of the protective extending portion 76. Such an extending portion reinforcing rib can be formed, such as by press-working an elongated region inward of the edge of the protective extending portion 76 to be convex when viewed from one surface side and concave when view from the other surface side.

An edge of the fixing portion 73 on the side where the electromagnetic shield member 50 extends is also formed into an additional rib 73P by being bent toward the side opposite to the electromagnetic shield member 50, similarly to the extending portion reinforcing rib 77. The extending portion reinforcing rib 77 is connected to the additional rib 73P. By bending the extending portion reinforcing rib 77 and the additional rib 73P into a curved surface, the curved surface of the bracket body 72 can contact the electromagnetic shield member 50.

The extending portion reinforcing rib 77 in the protective extending portion 76 is preferably present in a part or the entirety of a range from the fixing portion 74 to a tip part of the protective extending portion 76. In this way, the vibration of the protective extending portion 76 in the thickness direction is suppressed.

Note that the protective extending portion 76 may be formed with a hole 76*h*. In FIG. 7, the elliptical hole 76H is shown by a virtual line. The hole 76*h* may be set to have one of various shapes within a range in which the contact of the device B4 and the electromagnetic shield member 50 is avoided, in consideration of the position and shape of the device B4 and a positional relationship with the electromagnetic shield member 50. The size of the hole 76h may be set within such a range that the flexible electromagnetic shield member 50 hardly juts out from this hole 76h. It is not essential that the hole is formed into the above shape and the number of holes is arbitrary. For example, a plurality of round holes may be formed at intervals in vertical and horizontal directions in the protective extending portion 76. The protective extending portion 76 is reduced in weight by these holes.

Note that it is not essential to form the protective extending portion 76. Further, when the protective extending portion 76 is formed, it is not essential to form the extending portion reinforcing rib 77.

To accurately position the bracket fixing plate 78 and the other end part of the electromagnetic shield member 50 with respect to the bracket body 72, second positioning holes 73h and second positioning recesses 78h may be formed, similarly to the electromagnetic shield cover 60.

That is, the second positioning holes 73h are formed on the peripheral edge of the fixing portion 73 of the bracket body 72. The second positioning holes 73h correspond to the first positioning holes 63h. A plurality of the second positioning holes 73h are provided along a boundary along which the bracket fixing plate 78 is arranged. For example, the plurality of second positioning holes 73h are formed at intervals along one lone side (long side on a side opposite to the side where the electromagnetic shield member 50 extends) of the bracket fixing plate 78 to be overlapped on the fixing portion 73. Further, the second positioning holes 73h are also formed on edges on both short sides of the fixing portion 73. Note that the second positioning holes 73h formed on the edges on the both short sides of the fixing portion 73 are shaped to penetrate in the thickness direction of the fixing portion 73, but to be open outward from the short sides of the fixing portion 73 without being enclosed.

The second positioning recesses 78h are formed on the outer peripheral edge of the bracket fixing plate 78. The second positioning recesses 78h may be formed to have the same positions and same shape as the first positioning recesses 68h, assuming that the bracket fixing plate 78 and the cover fixing plate 68 have the same shape.

A correspondence relationship of the plurality of second positioning recesses 78h and the plurality of second positioning holes 73h is similar to that of the plurality of first positioning recesses 68h and the plurality of first positioning holes 63h.

In fixing the bracket fixing plate 78 to the fixing portion 73 of the bracket body 72 by press-working or the like, a plurality of second positioning pins P2 are inserted into the plurality of second positioning holes 73h and the plurality of second positioning recesses 78h in the same manner as described above. In this way, the bracket fixing plate 78 and the other end part of the electromagnetic shield member 50 are positioned with respect to the bracket body 72.

<Effects, Etc.>

According to the connector unit 10 configured as just described, the one end part of the electromagnetic shield member 50 is fixed by being sandwiched by the cover body 62 and the cover fixing plate 68. In this way, the electromagnetic shield member 50 can be fixed to the electromagnetic shield cover 60 even without providing an opening in the electromagnetic shield cover 60. In this way, the electromagnetic shield cover 60 covers the first connector 20 in a larger range, and an electromagnetic shielding effect by the electromagnetic shield cover 60 is enhanced. Further, the electrically conductive bracket 70 is fixed and grounded to the device B3 serving as a ground target part while being separated from the second connector 30. At this time, since the electrically conductive bracket 70 is formed with the reinforcing ribs 75, 77, the vibration of the electrically conductive bracket 70 in the thickness direction is suppressed and the electrically conductive bracket 70 is stably fixed in contact with the device B3. In this way, the electromagnetic shield member 50 is stably grounded and an electromagnetic shielding effect by the electromagnetic shield member 50 is enhanced. As a result, an electromagnetic shielding effect in the connector unit 10 is enhanced.

Further, the recesses 69 as the press marks are open toward the first device B1 with respect to the electromagnetic shield cover 60. Thus, the recesses 69 are arranged in a space surrounded by the electromagnetic shield cover 60 and the first device B1, and water is unlikely to stay in the recesses 69, thereby improving corrosion resistance.

Further, the recesses 79 as the press marks are open toward the device B3 with respect to the electrically conductive bracket 70. Thus, the recesses 79 are arranged in a space surrounded by the electrically conductive bracket 70 and the device B3, and water is unlikely to stay in the recesses 79, thereby improving corrosion resistance.

If the recesses 69, 79 are facing downward rather than in the horizontal direction, water is easily discharged to outside by gravity even if intruding into the recesses 69, 79. In this way, corrosion resistance is further improved.

Further, the second connector 30 includes the plurality of second terminals 32 and the second holding member 34 serving as a housing made of resin for holding the plurality of second terminals 32. That is, since the electrically conductive bracket 70 on the other end of the electromagnetic shield member 50 is fixed to the device B3 while being separated from the second connector 30, a combined configuration of the base member 25 and the resin portion 26 for grounding via the base member 25 may not be adopted unlike the first connector 20. In this way, many parts of the second connector 30 can be resin molded articles and the second connector 20 can be reduced in cost.

Further, since the electromagnetic shield member 50 covers the plurality of wires 40 on the one side, a used amount of the material of the electromagnetic shield member 50 can be reduced as compared to the case where the plurality of wires 40 are entirely covered. In this way, a weight reduction and a cost reduction are possible. Note that, in this case, the electromagnetic shield member 50 may be arranged only on one side (e.g. a side where the device B4 is arranged) requiring an anti-noise measure for the plurality of wires 40 in a relationship of the plurality of wires 40 and the other device B2 and the like.

Further, since the fixing portion reinforcing ribs 75 are formed on the fixing portion 74, the vibration of the electrically conductive bracket 70 in the thickness direction about the fixed position of the bracket fixing portion 74 to the device B3 is suppressed.

Particularly, an anti-vibration measure can be taken by the fixing portion reinforcing ribs 75 while a weight reduction is achieved by making the bracket fixing portion 74 narrower than the fixing portion 73.

Further, the electromagnetic shield member 50 can be protected from the device B4 and the like by the protective extending portion 76.

Further, by making the protective extending portion 76 narrower than the overlapping region of the bracket body 72 and the bracket fixing plate 78, the electromagnetic shield member 50 can be protected at a key point while a weight reduction is achieved. Since the protective extending portion 76 is reduced in weight, a part distant from the fixed position of the electrically conductive bracket 70 can be reduced in weight and the vibration of the electrically conductive bracket 70 is further suppressed.

Further, the vibration of the protective extending portion 76 in the thickness direction thereof is suppressed by forming the extending portion reinforcing rib 77 on the protective extending portion 76.

Furthermore, the protective extending portion 76 can be reduced in weight while expanding in a necessary region by forming the hole 76h in the protective extending portion 76. Further, the vibration of the electrically conductive bracket 70 is further suppressed by reducing the weight of the protective extending portion 76.

Note that the components described in the above embodiment and each modification can be combined as appropriate as long as those do not contradict each other.

LIST OF REFERENCE NUMERALS 10 connector unit
20 first connector
22 first terminal
24 first holding member
25 base member
26 resin portion
26h opening
30 second connector
32 second terminal
34 second holding member
34h opening
36 terminal block
40 wire
50 electromagnetic shield member
60 electromagnetic shield cover
62 cover body
62a covering part
62b fixing piece
63 fixing portion
63h first positioning hole
68 cover fixing plate
68h first positioning recess
69 recess
70 electrically conductive bracket
72 bracket body
73 fixing portion
73P additional rib
73h second positioning hole
74 bracket fixing portion
74h hole
75 reinforcing rib (fixing portion reinforcing rib)
76 protective extending portion
76h hole
77 reinforcing rib (extending portion reinforcing rib)
78 bracket fixing plate
78h second positioning recess
79 recess
B1 first device
B2 second device
B3 device (ground target device)
B4 device (peripheral device)
P1 first positioning pin
P2 second positioning pin

What is claimed is:

1. A connector unit, comprising:
a first connector;
a second connector;
a plurality of wires for electrically connecting the first connector and the second connector;
an electromagnetic shield member for covering the plurality of wires in a state capable of electromagnetic shielding;
an electromagnetic shield cover fixed to the first connector while covering the first connector; and
an electrically conductive bracket to be fixed to a ground target part while being separated from the second connector,
wherein the electromagnetic shield cover includes a cover body and a cover fixing plate to be fixed to the cover body,
one end part of the electromagnetic shield member is fixed to the electromagnetic shield cover by being sandwiched by the cover body and the cover fixing plate,
the electrically conductive bracket is fixed to another end part of the electromagnetic shield member,
the electrically conductive bracket includes a reinforcing rib projecting in a thickness direction of the electrically conductive bracket,
the electrically conductive bracket includes a bracket body to be fixed to the ground target part and a bracket fixing plate to be fixed to the bracket body,
the other end part of the electromagnetic shield member is fixed to the electrically conductive bracket by being sandwiched by the bracket body and the bracket fixing plate, and
one of the bracket body and the bracket fixing plate includes a protective extending portion extending in an extending direction of the electromagnetic shield member from an overlapping region of the bracket body and the bracket fixing plate.

2. The connector unit of claim 1, wherein:
a recess as a press mark for fixing the electromagnetic shield member is formed in at least one of the electromagnetic shield cover and the electrically conductive bracket, and
the recess is open toward the electromagnetic shield cover or a side of the electrically conductive bracket to be fixed.

3. The connector unit of claim 2, wherein the recess is open downward rather than in a horizontal direction.

4. The connector unit of claim 1, wherein the second connector includes a plurality of terminals to be connected to other ends of the plurality of wires and a housing made of resin for holding the plurality of terminals.

5. The connector unit of claim 1, wherein the electromagnetic shield member covers the plurality of wires only on one side in a direction perpendicular to an arrangement direction of the plurality of wires.

6. The connector unit of claim 1, wherein:
the electrically conductive bracket includes a bracket fixing portion extending toward the ground target part from a part fixed to the electromagnetic shield member, and
the reinforcing rib includes a fixing portion reinforcing rib formed on the bracket fixing portion.

7. The connector unit of claim 1, wherein the protective extending portion is formed to have a width smaller than a width of the overlapping region of the bracket body and the bracket fixing plate.

8. The connector unit of claim 1, wherein the reinforcing rib includes an extending portion reinforcing rib formed on the protective extending portion.

9. The connector unit of claim 1, wherein a hole is formed in the protective extending portion.

* * * * *